(12) United States Patent
Hasegawa

(10) Patent No.: US 10,381,399 B2
(45) Date of Patent: Aug. 13, 2019

(54) SEMICONDUCTOR DEVICE

(71) Applicant: CANON KABUSHIKI KAISHA, Tokyo (JP)

(72) Inventor: Shin Hasegawa, Hadano (JP)

(73) Assignee: Canon Kabushiki Kaisha, Tokyo (JP)

(*) Notice: Subject to any disclaimer, the term of this patent is extended or adjusted under 35 U.S.C. 154(b) by 14 days.

(21) Appl. No.: 15/726,602

(22) Filed: Oct. 6, 2017

(65) Prior Publication Data
US 2018/0130846 A1 May 10, 2018

(30) Foreign Application Priority Data
Oct. 31, 2016 (JP) ................ 2016-212797

(51) Int. Cl.
H01L 21/66 (2006.01)
H01L 27/146 (2006.01)
H01L 23/00 (2006.01)

(52) U.S. Cl.
CPC ........ *H01L 27/14687* (2013.01); *H01L 22/32* (2013.01); *H01L 24/02* (2013.01); *H01L 24/19* (2013.01); *H01L 24/20* (2013.01); *H01L 24/73* (2013.01); *H01L 24/92* (2013.01); *H01L 24/94* (2013.01); *H01L 27/14618* (2013.01); *H01L 27/14623* (2013.01); *H01L 27/14632* (2013.01); *H01L 27/14636* (2013.01); *H01L 24/11* (2013.01); *H01L 24/13* (2013.01); *H01L 24/29* (2013.01); *H01L 24/32* (2013.01); *H01L 2224/0239* (2013.01); *H01L 2224/02311* (2013.01); *H01L 2224/02313* (2013.01); *H01L 2224/02331* (2013.01); *H01L 2224/02371* (2013.01); *H01L 2224/0392* (2013.01); *H01L 2224/1132* (2013.01); *H01L 2224/11334* (2013.01); *H01L 2224/11849* (2013.01); *H01L 2224/131* (2013.01);
(Continued)

(58) Field of Classification Search
USPC .......................................... 257/48
See application file for complete search history.

(56) References Cited

U.S. PATENT DOCUMENTS 7,159,466 B2    1/2007  Hasegawa et al. ............. 73/721
2004/0077121 A1  4/2004  Maeda et al. .................. 438/75
(Continued)

FOREIGN PATENT DOCUMENTS

JP    2002-198463    7/2002
JP    2004-006834    1/2004
(Continued)

*Primary Examiner* — Timor Karimy
(74) *Attorney, Agent, or Firm* — Venable LLP

(57) ABSTRACT

Provided is a semiconductor device including: a first substrate having a first primary surface, a second primary surface, and a side surface; a semiconductor element formed on the first primary surface; a first electrode formed on the first primary surface and connected to the semiconductor element on the first primary surface; a second electrode formed on the second primary surface; a through-electrode formed so as to penetrate the first substrate and connecting the first electrode and the second electrode to each other; a second substrate bonded to the first substrate so as to face the first primary surface; and a third electrode formed on the side surface of the first substrate and connected to the second electrode.

13 Claims, 8 Drawing Sheets

(52) U.S. Cl.
CPC ............... *H01L 2224/13022* (2013.01); *H01L 2224/13024* (2013.01); *H01L 2224/214* (2013.01); *H01L 2224/29011* (2013.01); *H01L 2224/2919* (2013.01); *H01L 2224/32225* (2013.01); *H01L 2224/73253* (2013.01); *H01L 2224/92* (2013.01); *H01L 2224/9202* (2013.01); *H01L 2224/92242* (2013.01); *H01L 2224/94* (2013.01)

(56) References Cited

U.S. PATENT DOCUMENTS

| | | | |
|---|---|---|---|
| 2005/0009329 A1 | 1/2005 | Tanida et al. | 438/667 |
| 2005/0024519 A1 | 2/2005 | Nishida et al. | 348/340 |
| 2005/0062871 A1 | 3/2005 | Nishida et al. | 348/340 |
| 2008/0083965 A1 | 4/2008 | Ryu et al. | 257/433 |
| 2009/0256260 A1* | 10/2009 | Nakamura | H01L 27/14618 257/758 |
| 2009/0294779 A1* | 12/2009 | Ida | H01L 27/14618 257/82 |

FOREIGN PATENT DOCUMENTS

| | | |
|---|---|---|
| JP | 2004-063757 | 2/2004 |
| JP | 2004-063765 | 2/2004 |
| JP | 2004-063786 | 2/2004 |
| JP | 2008-130738 | 6/2008 |
| JP | 2009-206253 | 9/2009 |

* cited by examiner

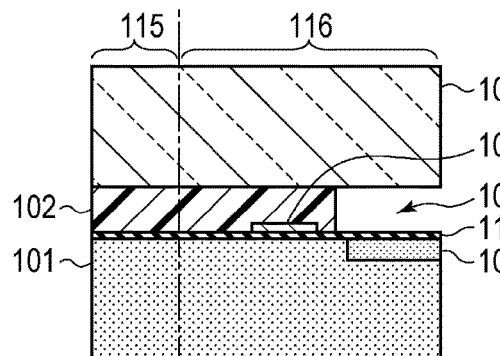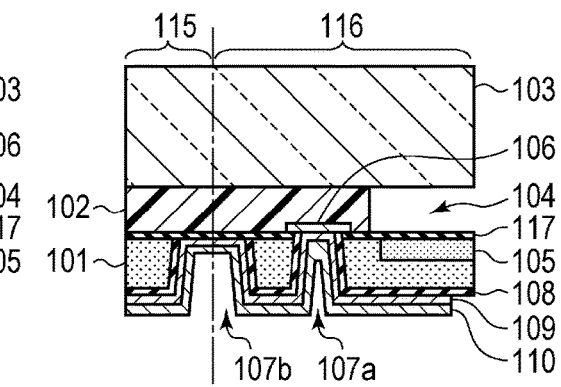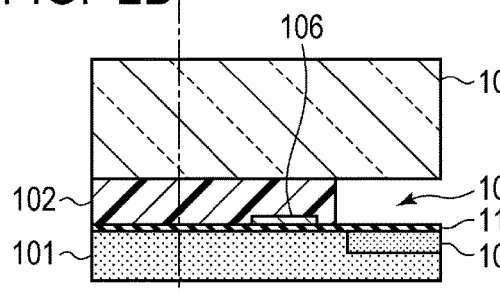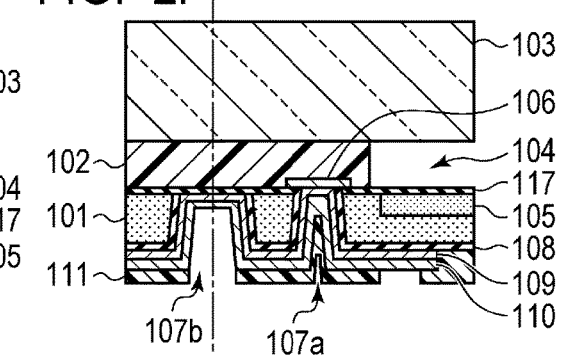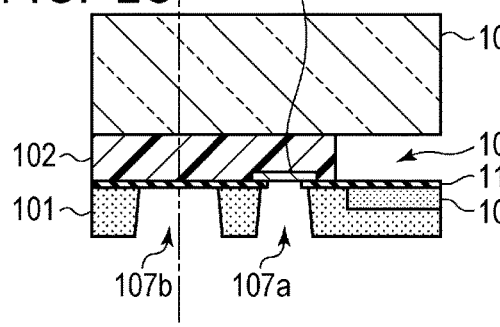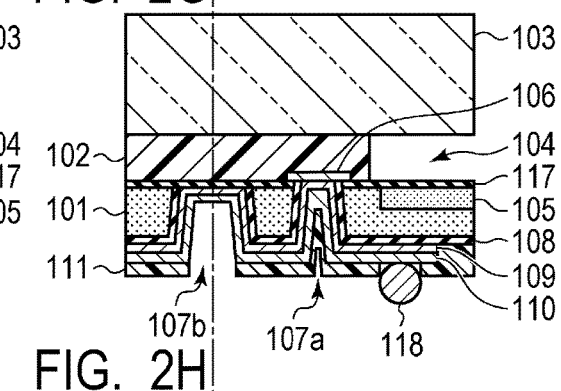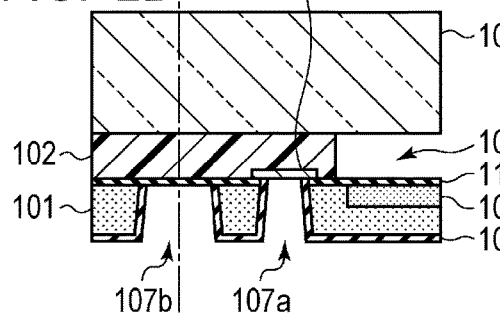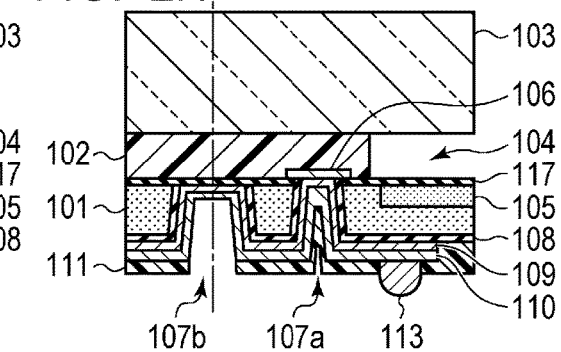

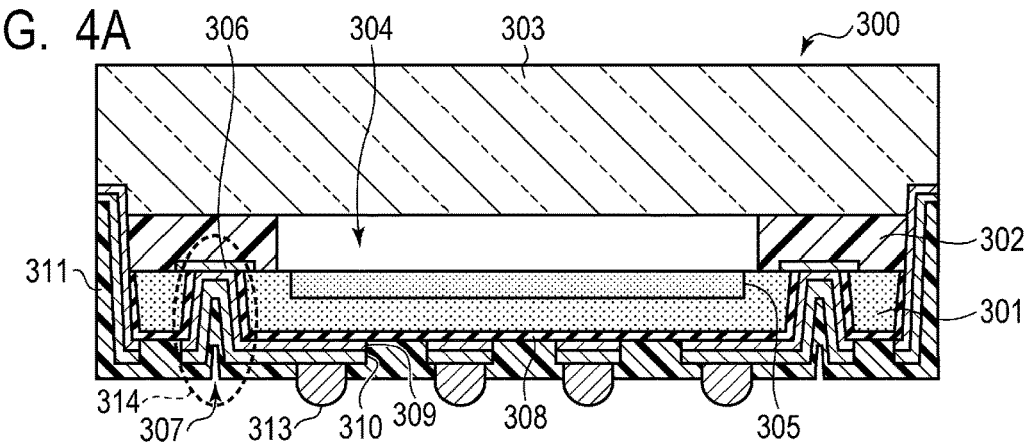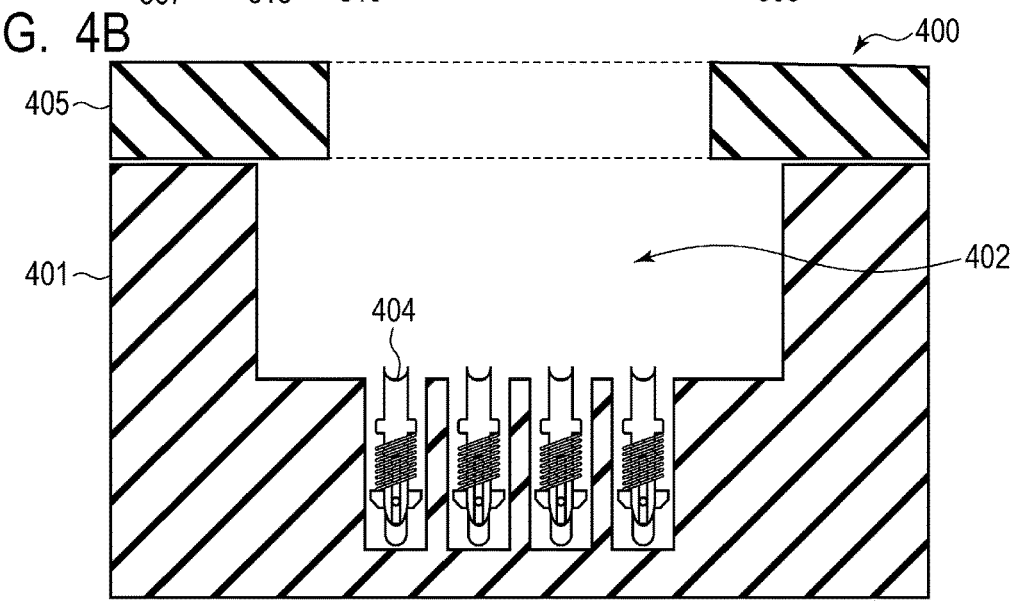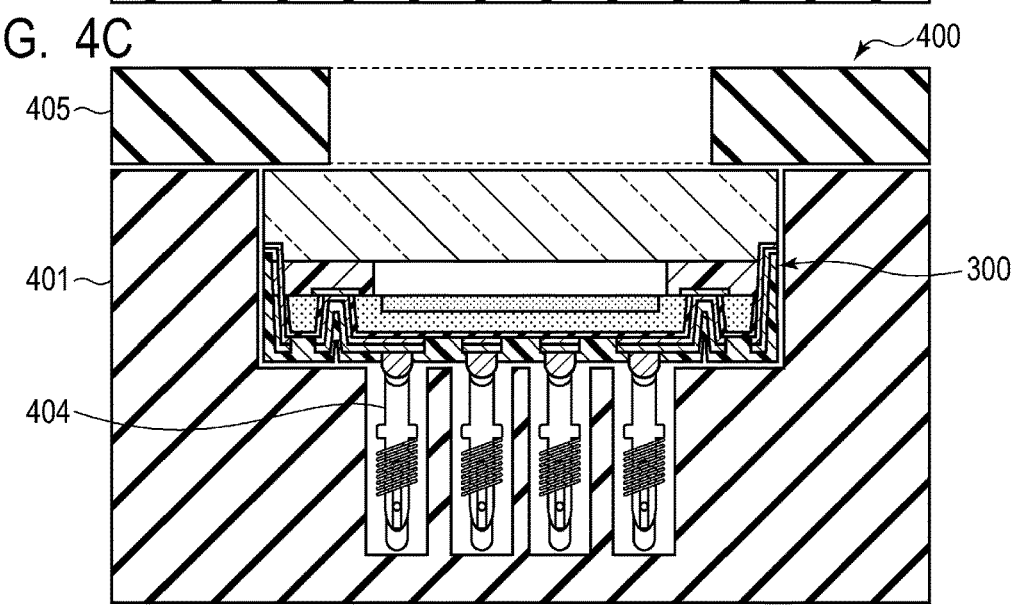

SEMICONDUCTOR DEVICE

BACKGROUND OF THE INVENTION

Field of the Invention

The present invention relates to a semiconductor device.

Description of the Related Art

As one of the packaging technologies of semiconductor devices, Wafer Level Chip Size Package (WLCSP) is known. WLCSP is a technology of assembling a package with a plurality of semiconductor devices being formed together on a wafer and then singulating it into individual semiconductor devices.

In the WLCSP, through-electrode structure may be employed in order to improve a reliability and reduce the size of a semiconductor device. Japanese Patent Application Laid-Open No. 2009-206253 discloses package structure having a through-electrode that connects an electrode on the front surface and an electrode on the back surface in a substrate. A signal from a solid state imaging device within a package is output to the outside of the package via the through-electrode.

In manufacturing of semiconductor devices having the WLCSP package structure, the singulated semiconductor device may be inspected for electrical characteristics. The inventers of the present application have found that a defect of a semiconductor device may occur in such an inspection step.

SUMMARY OF THE INVENTION

A semiconductor device according to one aspect of the present invention including: a first substrate having a first primary surface, a second primary surface, and a side surface; a semiconductor element formed on the first primary surface; a first electrode formed on the first primary surface and connected to the semiconductor element on the first primary surface; a second electrode formed on the second primary surface; a through-electrode formed so as to penetrate the first substrate and connecting the first electrode and the second electrode to each other; a second substrate bonded to the first substrate so as to face the first primary surface; and a third electrode formed on the side surface of the first substrate and connected to the second electrode.

Further features of the present invention will become apparent from the following description of exemplary embodiments with reference to the attached drawings.

BRIEF DESCRIPTION OF THE DRAWINGS

FIGS. 2A, 2B, 2C, 2D, 2E, 2F, 2G and 2H are sectional views illustrating a manufacturing method of the semiconductor device according to the first embodiment of the present invention.

FIGS. 4A, 4B and 4C are sectional views illustrating a step of inspecting a semiconductor device for electrical characteristics, according to a comparative example.

DESCRIPTION OF THE EMBODIMENTS

Figure 1:
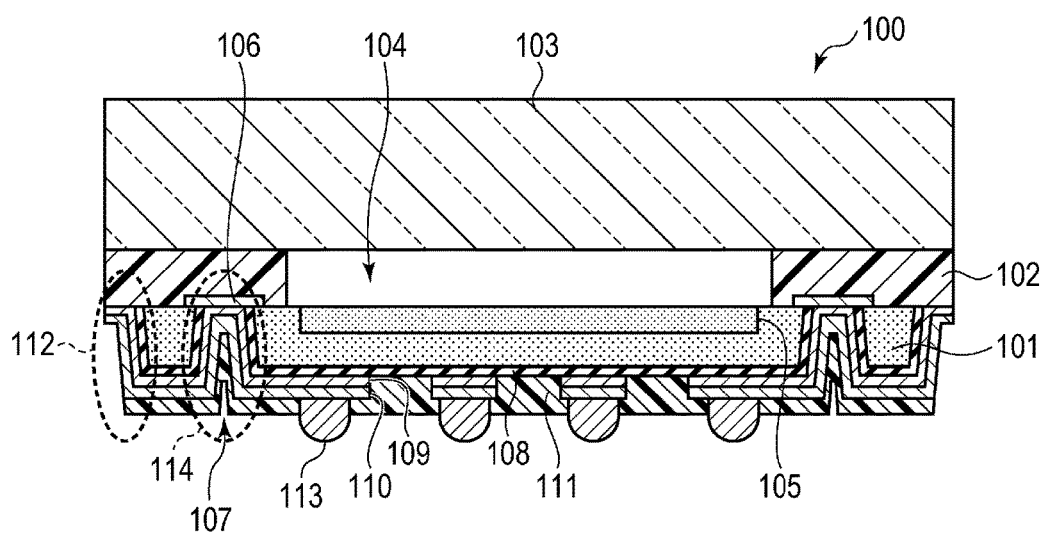
FIG. 1 is a sectional view of a semiconductor device according to the first embodiment of the present invention.

Preferred embodiments of the present invention will now be described in detail in accordance with the accompanying drawings. Throughout the drawings, the same members or the same components are provided with the same reference numerals. Further, in the following embodiments, duplicated description may be omitted or simplified.

Reference of one element being "connected" to another element in the present specification may include both the configuration in which these elements are conducted to each other without interposing any additional element and the configuration in which these elements are conducted to each other with interposing an additional element. In contrast, reference of one element being "directly connected" to another element means the configuration in which these elements are conducted to each other without interposing any additional element. However, when elements are connected to each other via only a contact layer, a junction such as an under-bump metal, or a layer necessary for diffusion prevention or the like, this case is included in the reference of "directly connected".

First Embodiment

FIG. 1 is a sectional view of a semiconductor device 100 according to the first embodiment of the present invention. The semiconductor device 100 is a solid state imaging device such as a Complementary Metal Oxide Semiconductor (CMOS) image sensor or the like. The semiconductor device 100 has the WLCSP structure in which a semiconductor substrate 101, which is a first substrate, and a support substrate 103, which is a second substrate, are bonded by an adhesion member 102. The semiconductor device 100 is manufactured by forming a plurality of semiconductor devices 100 together on a wafer and perform singulation after the completion of packaging. FIG. 1 illustrates a sectional view of one of the semiconductor devices 100 after singulation.

The semiconductor substrate 101 has a front surface electrode 106 (first electrode) and a semiconductor element 105 formed on a first primary surface (hereafter, referred to as a front surface) that is a surface of the upper side in FIG. 1. The semiconductor element 105 is a solid state imaging element including a photodiode, a transistor, and the like, for example. The semiconductor element 105 and the front surface electrode 106 are connected to each other by wiring (not illustrated) on the front surface of the semiconductor substrate 101. Note that an insulating film, a wiring layer, and the like (not illustrated) are further formed on the front surface of the semiconductor substrate 101. The support substrate 103 is bonded so as to face the front surface of the semiconductor substrate 101.

The semiconductor substrate 101 further has back surface electrodes 113 (second electrode) formed on a second primary surface (hereafter, referred to as a back surface) that is a surface of the underside in FIG. 1. The front surface electrode 106 and the back surface electrodes 113 are connected to each other by a through-electrode 114 formed in a through-hole 107 penetrating the semiconductor substrate 101. The adhesion member 102 is formed so as to surround the semiconductor element 105 in a frame-like shape and cover the through-hole 107 in a top view from a direction perpendicular to the primary surfaces of the semiconductor substrate 101. A region surrounded by the semiconductor substrate 101, the adhesion member 102, and the support substrate 103 defines a cavity 104. The semiconductor element 105 is formed inside the cavity 104 in the top view.

A plurality of the back surface electrodes 113 are formed on the back surface of the semiconductor substrate 101, and at least a part of the back surface electrodes 113 is formed in a region overlapping with the cavity 104 in the top view. The back surface electrodes 113 are directly connected to a rewiring layer including conductor layers 109 and 110 formed on the back surface of the semiconductor substrate 101. A part of the rewiring layer extends from the back surface to the side surface of the semiconductor substrate 101 and forms a side surface electrode 112 (third electrode). In other words, the side surface electrode 112 extends from the side surface to the back surface of the semiconductor substrate 101 and is directly connected to the back surface electrode 113. The back surface electrode 113 is a terminal formed by solder or the like and provided for connection to an external element. The plurality of back surface electrodes 113 are aligned in a grid, for example, and form the external terminal structure of a ball grid array. The side surface electrode 112 is a terminal used for measurement of electrical characteristics and is configured such that contact of a probe thereto allows for measurement of electrical characteristics of the semiconductor device 100.

FIG. 2A to FIG. 2H are sectional views illustrating one example of a manufacturing method of the semiconductor device 100 according to the first embodiment of the present invention. FIG. 2A to FIG. 2H illustrate the sectional structure around a boundary between a scribe region 115 that is removed by a step of dicing or the like in singulation and a function region 116 that will be the semiconductor device 100 after singulation.

FIG. 2A is a diagram illustrating a step of preparing a multilayer substrate in which the semiconductor substrate 101 and the support substrate 103 are bonded by the adhesion member 102. The semiconductor substrate 101 has the semiconductor element 105, an insulating layer 117, and the front surface electrode 106 on the front surface. The adhesion member 102 is formed on the front surface of the semiconductor substrate 101 so as to surround the semiconductor element 105 in a frame-like shape in the top view.

While a silicon substrate may typically be used for the semiconductor substrate 101, the semiconductor substrate 101 may be a substrate of other materials such as a compound semiconductor substrate. An epoxy resin, an acrylic resin, a silicone resin, or the like may be used for the adhesion member 102. A silicon substrate, a glass substrate, a metal substrate, a resin substrate, or the like may be used for the support substrate 103.

A preferable material when the semiconductor element 105 is a solid state imaging element will be described. The adhesion member 102 is preferably a black light-shielding resin for absorbing an unnecessary incident light. Further, the adhesion member 102 is preferably an epoxy resin for improving a humidity resistance. The support substrate 103 is preferably a substrate having an optical transparency such as a glass such as a quartz glass, a crystal quartz, a plastic, or the like. Furthermore, when the semiconductor substrate 101 is a silicon substrate in order to form a solid state imaging element, it is more preferable that the support substrate 103 be a glass with a composition whose linear expansion coefficient is close to that of a silicon for reducing an influence of a thermal stress caused by a difference of the linear expansion coefficients.

FIG. 2B is a diagram illustrating a step of thinning the semiconductor substrate 101. The thickness of the semiconductor substrate 101 is typically reduced to a range from several tens microns to a hundred and several tens microns such as by grinding the back surface of the semiconductor substrate 101. A back surface grinding device, a plasma etching device, a wet etching device, a Chemical Mechanical Polishing (CMP) device, a dry polishing device, or the like may be used for the thinning step. Further, thinning may be performed by using two or more these devices.

FIG. 2C is a diagram illustrating a step of forming through-holes 107a and 107b in the thinned semiconductor substrate 101. For example, a Reactive Ion Etching (RIE) device may be used for formation of the through-holes 107a and 107b. The through-hole 107a is formed in the function region 116 and is a hole reaching the front surface electrode 106 from the back surface of the semiconductor substrate 101. The through-hole 107b is formed extending across the function region 116 and the scribe region 115 and is a hole reaching the insulating film 117 from the back surface of the semiconductor substrate 101. So called Bosch process may be used for the RIE process, or other process may be used. Further, the process used for forming the through-holes 107a and 107b may be a process other than the RIE, for example, anisotropy wet etching or laser drilling, or two or more of these processes may be used.

FIG. 2D is a diagram illustrating a step of forming the insulating layer 108 on the back surface of the semiconductor substrate 101, the side surface of the through-hole 107a, and the side surface and the bottom surface of the through-hole 107b. The insulating layer 108 is formed by depositing an insulating film on the back surface of the semiconductor substrate 101 using a plasma Chemical Vapor Deposition (CVD) method and then removing the insulating film from the bottom surface of the through-hole 107a. The removal of the insulating film may be performed by a series of steps including resist application, exposure, development, and etching, for example.

FIG. 2E is a diagram illustrating a step of forming the conductor layer 109 including a multilayer film of a barrier metal and a seed metal and a step of forming the conductor layer 110 by performing electroplating of a copper using the seed metal as a seed. For example, a titanium may be used for the barrier metal. For example, a copper may be used for the seed metal. As another example, a titanium nitride, a tantalum, or a tantalum nitride may be used for the barrier metal. Further, as another example, a ruthenium may be used for the seed metal. By these steps, a rewiring layer including the conductor layers 109 and 110 is formed on the back surface of the semiconductor substrate 101. This rewiring layer is formed so as to connect the inside of the through-hole 107a, the inside of the through-hole 107b, and the back surface electrode 113 to each other.

An example of a patterning method of a rewiring layer including the conductor layers 109 and 110 will be described. First, a multilayer film of a barrier metal and a seed metal is formed on the entire surface of the back surface of the semiconductor substrate 101. Next, a protective film such as a resist is formed on a portion other than a portion where the rewiring layer is to be formed. Then, the patterning of a rewiring layer is completed by performing electroplating to grow a deposition film in a region having no protective film, subsequently removing the protective film, and further removing the barrier metal and the seed metal of a region having no deposition film. FIG. 2E illustrates a state after pattering.

FIG. 2F is a diagram illustrating a step of forming a back surface protective film 111 such as a solder resist on portions other than a portion of the through-hole 107b and other than a portion where the back surface electrodes 113 are formed.

FIG. 2G is a diagram illustrating a step of mounting a solder ball 118 on a portion where the back surface electrode 113 is formed. Instead of mounting the solder ball 118, cream solder may be applied by screen printing or the like.

FIG. 2H illustrates a step of fusing the solder ball 118 and fusing the solder with the conductor layer 110 by heating it to a temperature above the melting point of the solder using a reflow soldering device. The solder is then solidified by cooling, and the back surface electrode 113 is formed. The semiconductor device 100 illustrated in FIG. 1 is then formed by cutting off the portion of the scribe region 115 by using a dicer or the like for singulation.

Figure 3A:
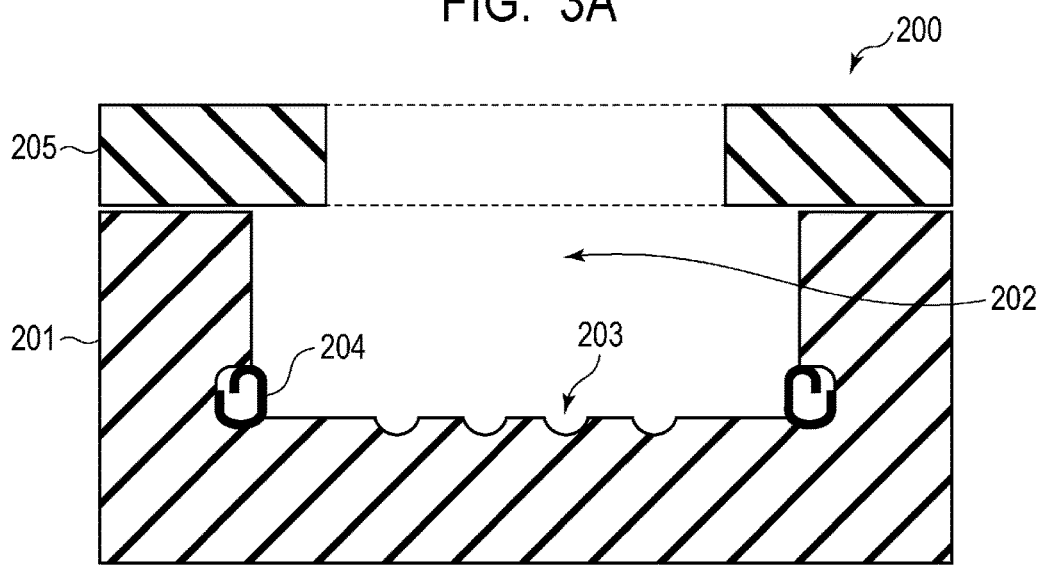
FIG. 3A and FIG. 3B are sectional views illustrating a step of inspecting the semiconductor device for electrical characteristics, according to the first embodiment of the present invention.
Figure 3B:
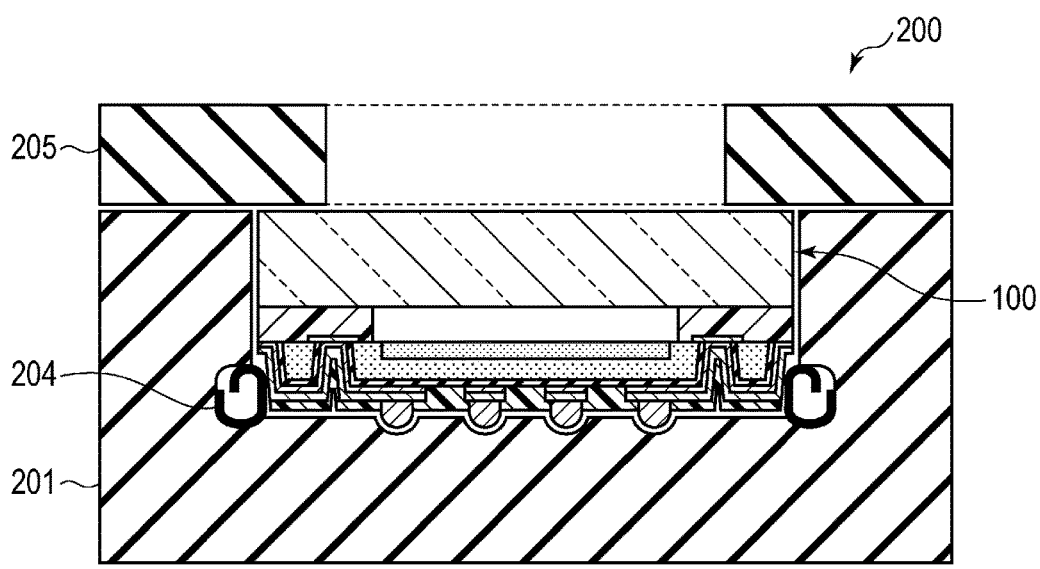

FIG. 3A and FIG. 3B are sectional views illustrating a method of inspecting the semiconductor device 100 for electrical characteristics, according to the first embodiment of the present invention. FIG. 3A is a sectional view of a socket 200 used for inspection of the semiconductor device 100 for the electrical characteristics. The socket 200 has a socket body 201 and a socket cover 205. A recess-shaped placing portion 202 for placing the semiconductor device 100 is formed in the socket body 201. Recesses 203 for avoiding contact of the back surface electrode 113 of the semiconductor device 100 with the socket body 201 are formed on the bottom surface of the placing portion 202. A probe 204 is provided in the side surface of the placing portion 202 of the socket body 201. The probe 204 is connected to an external terminal of the socket 200 via a wiring inside the socket body 201 and is connectable to input and output terminals of a measuring instrument used for inspection. The socket cover 205 is provided to the upper part of the socket body 201 and configured to be able to be opened and closed.

FIG. 3B is a sectional view illustrating a state where the semiconductor device 100 is placed on the placing portion 202 of the socket 200. With reference thereto, a step of inspecting the semiconductor device 100 for the electrical characteristics will be described. First, the socket cover 205 is opened, and the semiconductor device 100 is placed on the placing portion 202 of the socket 200. The socket cover 205 is then closed, and thereby the probe 204 is pushed against the side surface electrode 112 of the semiconductor device 100. Thereby, electrical connection of the semiconductor device 100 and the socket 200 can be obtained.

In this state, the recesses 203 are formed in the positions corresponding to the back surface electrodes 113 formed under the cavity 104 of the semiconductor device 100, and neither the probe 204 nor the socket body 201 contacts with the back surface electrodes 113. Therefore, deformation and break of the semiconductor substrate 101 due to the back surface electrodes 113 being subjected to a pressure from the socket 200 is less likely to occur. Furthermore, since the internal stress applied to the semiconductor substrate 101 on which the semiconductor element 105 is formed is reduced during inspection, a change in electrical characteristics due to a change in the carrier mobility and a change in a dark current property caused by the stress is reduced and therefore a measurement error in inspection is reduced. Further, deformation and break in response to a stress being directly applied to the back surface electrode 113 is less likely to occur, which reduces occurrence of a junction defect when the semiconductor device 100 is implemented on a printed wiring board or the like.

According to the present embodiment, with at least one of the advantages described above, probing for inspection can be appropriately performed and occurrence of a defect due to inspection can be suppressed. Thus, a semiconductor device which can reduce occurrence of a defect is provided.

A comparative example used for illustrating the advantages of the present embodiment in detail will be described with reference to FIG. 4A, FIG. 4B, and FIG. 4C. FIG. 4A is a sectional view of a semiconductor device 300 according to the comparative example. The semiconductor device 300 has the WLCSP structure in which a semiconductor substrate 301 and a support substrate 303 are bonded by an adhesion member 302. A semiconductor element 305 is formed on the front surface of the semiconductor substrate 301. The adhesion member 302 is formed in a frame-like shape so as to surround the semiconductor element 305, and thereby a cavity 304 is formed inside the semiconductor device 300.

A front surface electrode 306 is formed on the front surface of the semiconductor substrate 301. The front surface electrode 306 is connected to a rewiring layer including the conductor layers 309 and 310 formed on an insulating layer 308 on the back surface via a through-electrode 314 formed in a through-hole 307 penetrating the semiconductor substrate 301. The rewiring layer is directly connected to the back surface electrodes 313 that are external connection terminals.

The semiconductor device 300 of this comparative example is different from the semiconductor device 100 of the first embodiment in the relationship of the side surface structure and the electrical connection of the rewiring layer around the side surface. The entire side surface of the semiconductor device 300 including an end face of the adhesion member 302 is covered by the conductor layers 309 and 310 and a back surface protective film 311 for improving the humidity resistance. Further, the conductor layers 309 and 310 on and around the side surface of the semiconductor device 300 are not connected to the through-electrode 314 and the back surface electrodes 313 and does not function as a terminal used for measurement in inspection.

FIG. 4B is a sectional view of a socket 400 used for inspection of the semiconductor device 300 for the electrical characteristics. The socket 400 has a socket body 401 and a socket cover 405. A recess-shaped placing portion 402 for placing the semiconductor device 300 is formed in the socket body 401. Probes 404 for obtaining electrical connection to the back surface electrodes 313 are provided in the bottom surface of the placing portion 402. In such a way, the probes 404 of this comparative example are provided so as to contact with the back surface electrode 313 instead of the side surface electrode, which makes a difference from the probe 204 of the first embodiment.

FIG. 4C is a sectional view illustrating a state where the semiconductor device 300 is placed on the placing portion 402 of the socket 400. In this comparative example, once the semiconductor device 300 is placed on the placing portion 402 of the socket 400 and the socket cover 405 is closed, the back surface electrodes 313 of the semiconductor device 300 push the probes 404 downward and thereby electrical connection of the semiconductor device 300 and the socket 400 is obtained. At this time, the back surface electrodes 313 are subjected to a pressure from the probes 404 in a direction perpendicular to a plane of the semiconductor substrate 301. This is likely to cause deformation and break of the semiconductor substrate 301. Even when the semiconductor substrate 301 is not broken, an internal stress applied to the semiconductor substrate 301 may cause a change in the carrier mobility and a change in the dark current property. In this case, since the electrical characteristics of the semiconductor device 300 may change and thus causes a measurement error in inspection, an error may occur in an inspection result. Further, this pressure may cause deformation and break of the back surface electrodes 313. In this case, a junction defect may occur when the semiconductor device 300 is implemented on a printed wiring board or the like.

Because of the above reasons, the semiconductor device 300 according to the comparative example is likely to cause a defect due to probing that causes the probes 404 to contact with the back surface electrodes 313 in an inspection step using the socket 400. In contrast, the semiconductor device 100 of the present embodiment has the configuration in which probing is performed by causing the probe 204 to contact with the side surface electrode 112 and has the configuration in which the socket body 201 does not contact with the back surface electrodes 113 because of the presence of the recesses 203. Therefore, according to the present embodiment, probing for inspection can be appropriately performed, and occurrence of a defect due to inspection can be suppressed. Thus, a semiconductor device that can reduce occurrence of a defect is provided.

Second Embodiment

Figure 5:
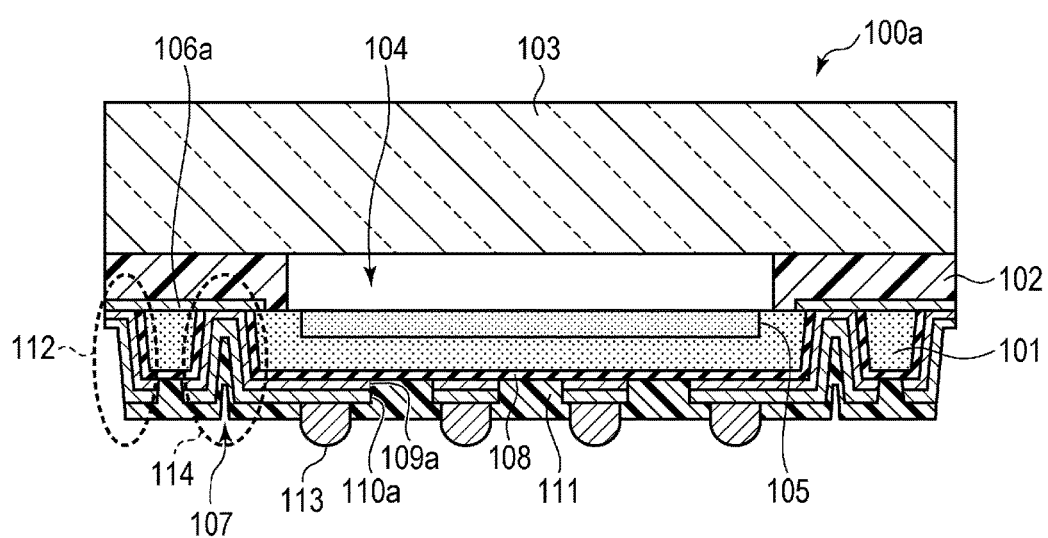
FIG. 5 is a sectional view of a semiconductor device according to a second embodiment of the present invention.
Figure 6A:
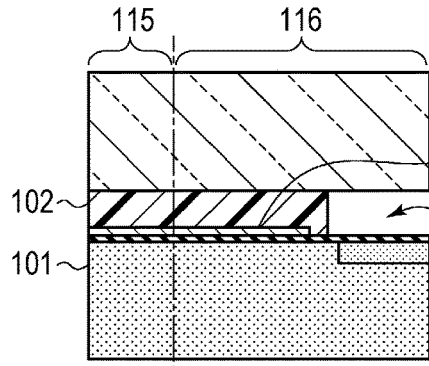
FIGS. 6A, 6B, 6C, 6D, 6E, 6F, 6G and 6H are sectional views illustrating a manufacturing method of the semiconductor device according to the second embodiment of the present invention.
Figure 6B:
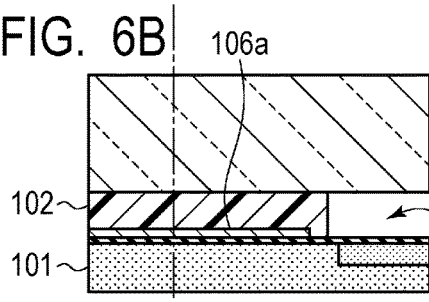
Figure 6C:
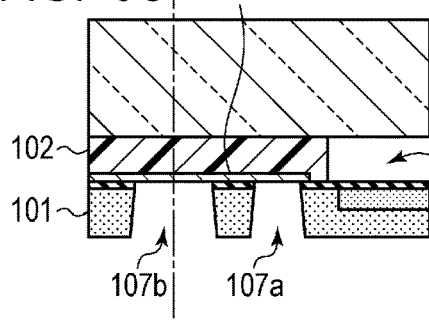
Figure 6D:
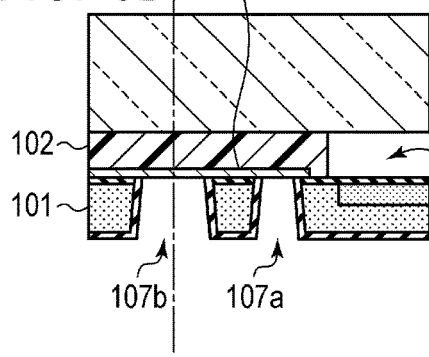
Figure 6E:
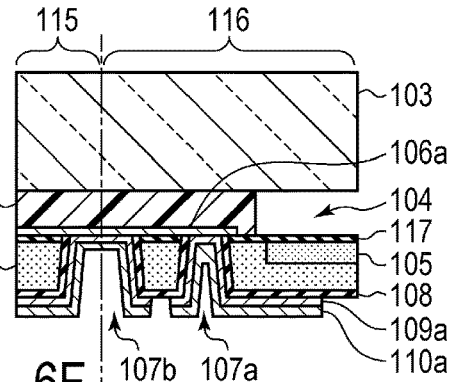
Figure 6F:
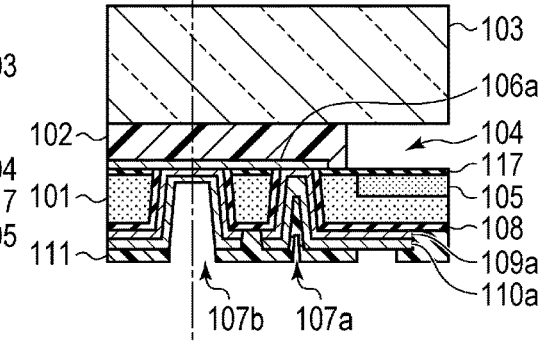
Figure 6G:
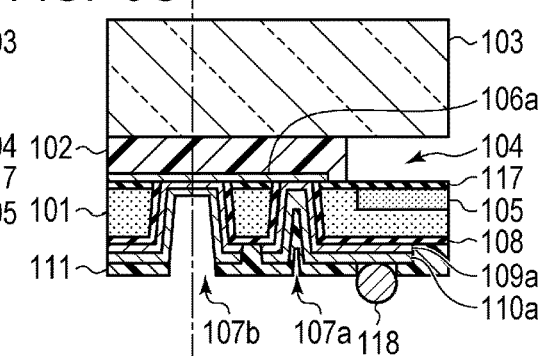
Figure 6H:
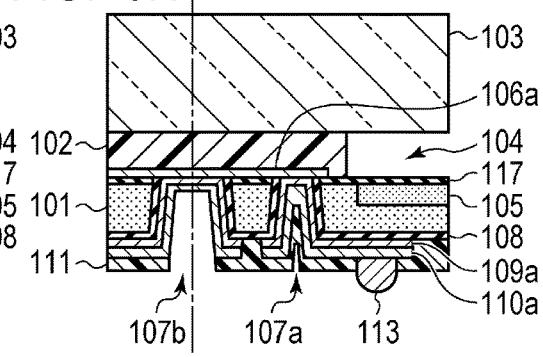

FIG. 5 is a sectional view of a semiconductor device 100a according to a second embodiment of the present invention. The second embodiment is different from the first embodiment in the following points. First, a front surface electrode 106a extends to a portion near the side surface of the semiconductor substrate 101 and is directly connected to the side surface electrode 112. Second, neither the conductor layers 109a nor 110a of the side surface electrode 112 is directly connected to the back surface electrodes 113 on the back surface of the semiconductor substrate 101, but connected via the front surface electrode 106a and the through-electrode 114 on the back surface electrode 113. Thereby, in the present embodiment, a part of the wiring between the side surface electrode 112 and the back surface electrode 113 extends through the front surface electrode 106a formed inside the semiconductor device 100a. Since other features are the same as those of the first embodiment, the description thereof will be omitted.

FIG. 6A to FIG. 6H are sectional views illustrating an example of a manufacturing method of the semiconductor device 100a according to the second embodiment of the present invention. Since the manufacturing steps of the present embodiment are similar to those in the first embodiment except the structural difference described above, the description thereof will be omitted.

Also in the present embodiment, the same advantages as those in the first embodiment can be obtained. Furthermore, the present embodiment has the wiring structure in which a part of the wiring between the side surface electrode 112 and the back surface electrodes 113 extends through the front surface electrode 106a formed inside the semiconductor device 100a. This allows for an additional advantage of a reduction in likelihood of damage due to contact with another member or the like when the semiconductor device 100a is handled.

Third Embodiment

Figure 7:
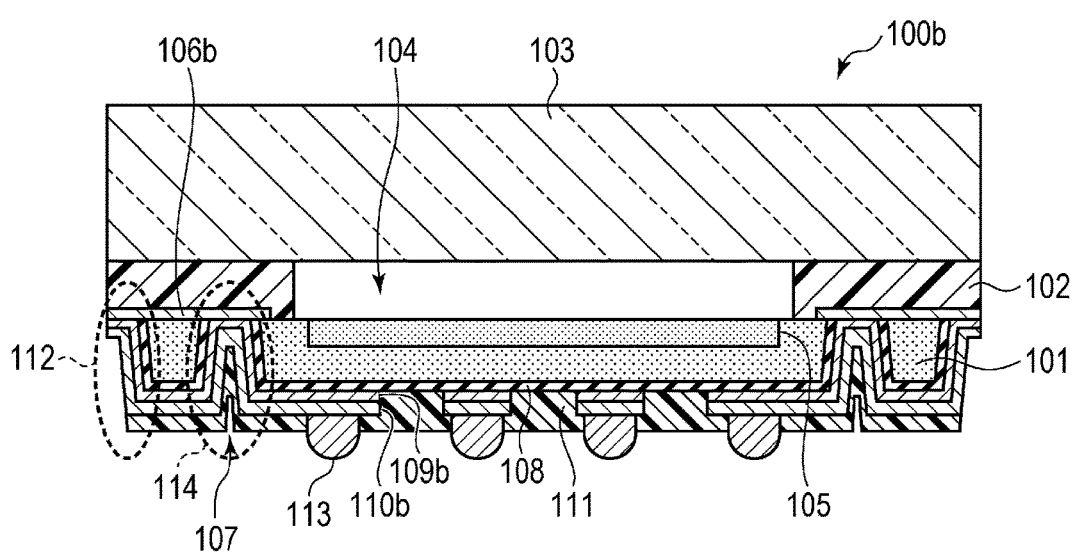
FIG. 7 is a sectional view of a semiconductor device according to a third embodiment of the present invention.
Figure 8A:
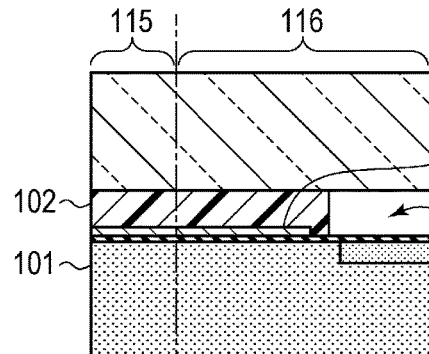
FIGS. 8A, 8B, 8C, 8D, 8E, 8F, 8G and 8H are sectional views illustrating a manufacturing method of the semiconductor device according to the third embodiment of the present invention.
Figure 8E:
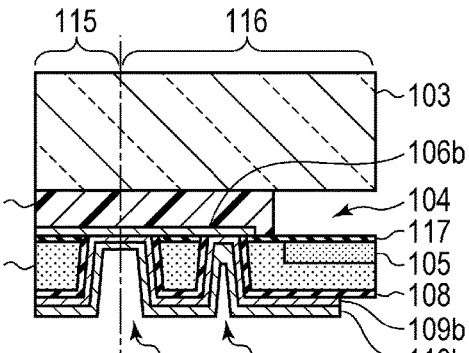
Figure 8B:
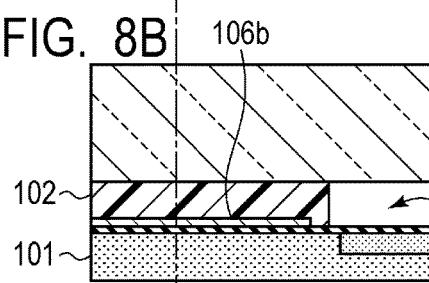
Figure 8F:
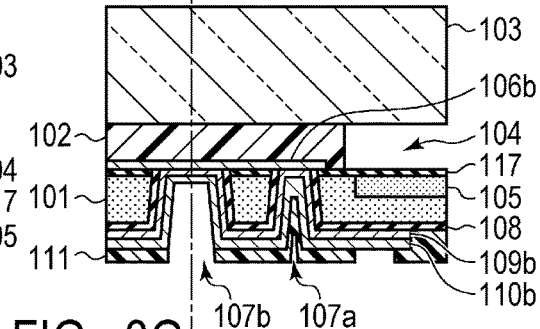
Figure 8C:
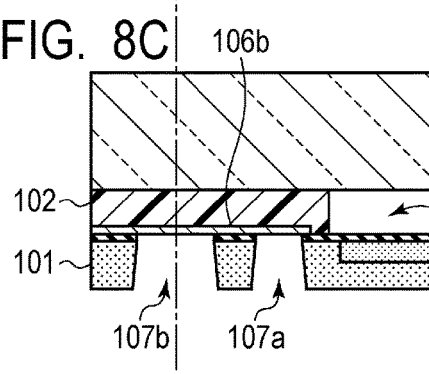
Figure 8G:
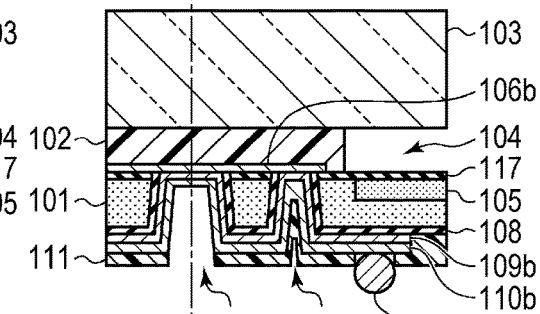
Figure 8D:
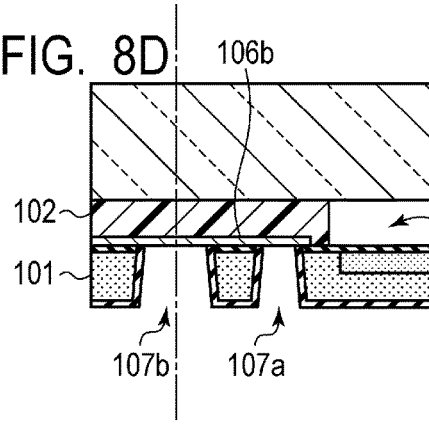
Figure 8H:
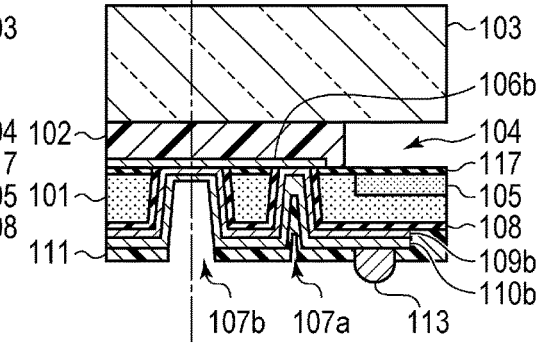

FIG. 7 is a sectional view of a semiconductor device 100b according to a third embodiment of the present invention. The third embodiment is different from the first embodiment in that a front surface electrode 106b extends to a portion near the side surface of the semiconductor substrate 101 and is directly connected to the side surface electrode 112. This results in the structure in which a rewiring layer including the conductor layers 109b and 110b of the side surface electrode 112 is directly connected to the back surface electrodes 113 and is further connected to the back surface electrodes 113 via the front surface electrode 106b and the through-electrode 114. In other words, the side surface electrode 112 is directly connected to both the front surface electrode 106b and the back surface electrodes 113, and thereby double paths between the side surface electrode 112 and the back surface electrodes 113 are formed. Since other features are the same as those of the first embodiment, the description thereof will be omitted.

FIG. 8A to FIG. 8H are sectional views illustrating an example of a manufacturing method of the semiconductor device 100b according to the third embodiment of the present invention. Since the manufacturing steps of the present embodiment are similar to those in the first embodiment except the structural difference described above, the description thereof will be omitted.

Also in the present embodiment, the same advantages as those in the first embodiment and the second embodiment can be obtained. Furthermore, in the present embodiment, since the double paths are formed from the front surface electrode 106b to the back surface electrode 113 and this allows for redundancy, even when one of the paths is broken, a signal can be transferred via the other path. Therefore, an additional advantage of improvement of the yield rate of the semiconductor device 100b can be obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-212797, filed Oct. 31, 2016, which is hereby incorporated by reference herein in its entirety.

What is claimed is:

1. A semiconductor device comprising:
    a first substrate having a first primary surface, a second primary surface, an internal side surface which surrounds a through-hole formed in the first substrate, and an outer side surface which surrounds at least a part of the first substrate;
    a semiconductor element formed on the first primary surface;
    a first electrode formed on the first primary surface and connected to the semiconductor element on the first primary surface;
    a second electrode formed on the second primary surface;
    a through-electrode formed in the through-hole, the through-hole being formed so as to penetrate the first substrate, and the through-electrode connecting the first electrode and the second electrode to each other;
    a second substrate bonded to the first substrate so as to face the first primary surface; and
    a third electrode formed on the outer side surface of the first substrate and connected to the second electrode.

2. The semiconductor device according to claim 1, wherein the third electrode extends from the outer side surface to the second primary surface and is directly connected to the second electrode.

3. The semiconductor device according to claim 1,
wherein the first electrode extends to the outer side surface of the first substrate, and
wherein the third electrode is directly connected to the first electrode at the outer side surface of the first substrate, and is electrically connected to the second electrode via the first electrode and the through-electrode.

4. The semiconductor device according to claim 1,
wherein the first electrode extends to the outer side surface of the first substrate, and
wherein the third electrode is directly connected to both the first electrode and the second electrode.

5. The semiconductor device according to claim 4, wherein the third electrode is formed integral with the through-electrode and the second electrode.

6. The semiconductor device according to claim 1,
wherein the semiconductor element includes a solid state imaging element, and
wherein the second substrate has an optical transparency.

7. The semiconductor device according to claim 1,
wherein the first substrate and the second substrate are bonded so as to form a cavity between the first substrate and the second substrate, and
wherein the semiconductor element is formed inside the cavity in a top view.

8. The semiconductor device according to claim 7, wherein at least a part of the second electrode is formed inside the cavity in the top view.

9. The semiconductor device according to claim 7,
wherein the first substrate and the second substrate are bonded by an adhesion member formed in a frame-like shape, and
wherein a region surrounded by the first substrate, the second substrate, and the adhesion member defines the cavity.

10. The semiconductor device according to claim 1,
wherein the second electrode is a terminal for connection to an external element, and
wherein the third electrode is a terminal for measurement of electrical characteristics.

11. The semiconductor device according to claim 1, wherein the third electrode is configured to be electrically connectable to an input node or an output node of a measuring instrument used for inspection of the semiconductor substrate.

12. The semiconductor device according to claim 1, wherein in a direction perpendicular to the outer side surface of the first substrate, the first substrate is present on a first direction side relative to the third electrode perpendicular to the outer side surface of the first substrate, and is not present on a second direction side opposite to the first direction side relative to the third electrode.

13. The semiconductor device according to claim 1, wherein the through-electrode is formed on an extends along the internal side surface of the first substrate.

* * * * *